United States Patent [19]

Beun

[11] Patent Number: 4,702,535
[45] Date of Patent: Oct. 27, 1987

[54] ELECTRONIC EQUIPMENT DRAWER

[75] Inventor: Roger A. Beun, Dunrobin, Canada

[73] Assignee: Northern Telecom Limited, Montreal, Canada

[21] Appl. No.: 851,843

[22] Filed: Apr. 9, 1986

[30] Foreign Application Priority Data

Feb. 24, 1986 [CA] Canada ................................ 502555

[51] Int. Cl.⁴ .......................................... A47B 81/00
[52] U.S. Cl. ..................................... 312/308; 211/41;
312/223; 312/330 R; 361/391; 361/415
[58] Field of Search ............... 312/320, 308, 223, 310,
312/330 R; 211/41; 361/390, 391, 415

[56] References Cited

U.S. PATENT DOCUMENTS

| | | | |
|---|---|---|---|
| 3,131,330 | 4/1964 | Allen | 361/390 |
| 3,335,326 | 8/1967 | Bonin et al. | 361/391 X |
| 3,376,479 | 4/1968 | Wines et al. | 361/391 X |
| 3,656,058 | 4/1972 | Leathers | 361/415 X |
| 3,904,937 | 9/1975 | Levin | 361/415 X |
| 4,233,646 | 11/1980 | Leung et al. | 211/41 X |
| 4,356,531 | 10/1982 | Marino et al. | 361/415 X |
| 4,444,318 | 4/1984 | Alexander | 211/41 |
| 4,452,359 | 6/1984 | Koppensteiner | 211/41 |
| 4,466,049 | 8/1984 | Chaney et al. | 361/415 X |
| 4,468,718 | 8/1984 | Main | 361/415 X |

FOREIGN PATENT DOCUMENTS

| | | | |
|---|---|---|---|
| 2445274 | 4/1976 | Fed. Rep. of Germany | 361/391 |
| 47935 | 3/1969 | German Democratic Rep. | 361/390 |
| 663143 | 5/1979 | U.S.S.R. | 361/415 |

Primary Examiner—Kenneth J. Dorner
Assistant Examiner—Thomas A. Rendos

[57] ABSTRACT

An electronic equipment drawer assembly which has a readily replaceable faceplate assembly mounted on a printed circuit board which in turn, slides into the drawer. To ensure damage does not occur to the printed circuit board, when the drawer is opened or closed by a force applied to the faceplate, the unit is designed so that such a force is transferred directly to the drawer and not through the printed circuit board to the drawer.

6 Claims, 7 Drawing Figures

ELECTRONIC EQUIPMENT DRAWER

This invention relates to an electronic equipment drawer assembly and more particularly to one in which the drawer disposed therein has a faceplate which can be readily exchanged for another one during servicing or replaced by one having a different configuration.

BACKGROUND OF THE INVENTION

Equipment drawers are widely used throughout the electronics industry particularly in high density applications employing printed circuit boards on which are mounted electronic modules and components. Two configurations are commonly employed. In one configuration, the circuit boards are slid directly into the cabinet through a front opening therein, on guide rails or tracks which run orthogonal to the opening. In this configuration, the back plane of the cabinet usually contains multicontact connectors which mate with contact pins on each of the circuit boards. These connectors interconnect the boards with each other and/or with external circuitry.

In an alternate configuration, the cabinet contains a plurality of pull-out drawers which are slideably mounted in the cabinet through its front opening so that they can be opened and closed for servicing or installation of the printed circuit boards. Each drawer includes sets of opposed tracks for slideably retaining the circuit boards. These tracks in turn are disposed orthogonal to the direction of movement of the drawer when it is pushed in or pulled out of the cabinet. In such an arrangement, it is usual to have a faceplate on the front of the drawer both to protect the adjacent circuit board and in many instances to provide control functions such as lights, switches, or buttons.

In addition where a multiplicity of drawers are contained in the same cabinet, it is not unusual to have different faceplates on each of the drawers. These faceplates which have electrical interconnections from the various components mounted thereon to the rest of the electronic circuitry in the drawer, must be readily replaceable should component failure develop.

STATEMENT OF THE INVENTION

It has been found that an easily installed and readily replaceable faceplate assembly can be provided by mounting a faceplate on an adjacent circuit board so that both the board and the faceplate are inserted in the drawer as a unit. However with such an arrangement any pressure or force exerted on the faceplate when the drawer is pushed into or pulled out of the cabinet, must not be transferred to the circuit board on which it is mounted else damage to the board could readily occur. This problem has been overcome in the present invention by locating the board contiguous to the surface of the front side of the drawer so that any force applied to the faceplate to push the drawer in, is substantially transferred directly to the drawer and not to the circuit board.

Thus, in accordance with the present invention there is provided an electronic equipment drawer which comprises a cabinet having an opening in its front and a drawer slideably mounted in the cabinet through the opening, which can be moved into or out of the cabinet for servicing. The drawer includes sets of opposed tracks for slideably retaining a plurality of circuit boards. The sets of opposed tracks are disposed orthogonal to the direction of movement of the drawer. Also included is a faceplate for covering the front of the drawer. The faceplate is mounted on and parallel to an adjacent circuit board so that portions of the faceplate are contiguous the surface of the front of the drawer. As a result any force applied to the faceplate to push the drawer in, is substantially transferred directly to the drawer and not through the circuit board to it.

In a particular embodiment, the faceplate and the drawer have mating pairs of keys and keyholes which extend parallel to the tracks so that they slideably engage each other when the circuit board is inserted in the drawer. As a result, a pulling force applied to the faceplate to withdraw the drawer is substantially transferred directly through the mating pairs of keys and keyholes to the drawer and not to the circuit board on which the faceplate is mounted. In addition to protecting the circuit board from damage, these mating keys and keyholes also ensure proper alignment of the faceplate when it is installed in the drawer.

BRIEF DESCRIPTION OF THE DRAWINGS

An example embodiment of the invention will now be described with reference to the accompanying drawings in which.

DESCRIPTION OF THE PREFERRED EMBODIMENT

Figure 1:
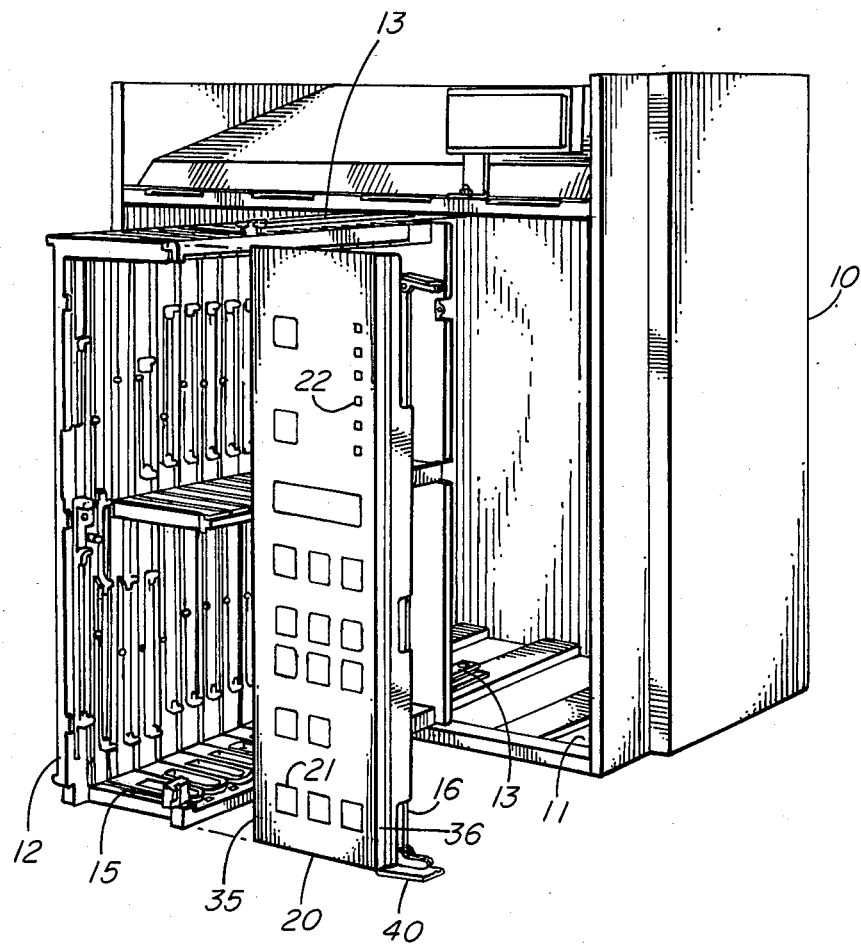
FIG. 1 is an exploded perspective view of an electronic equipment drawer assembly in accordance with the present invention.
Figure 2:
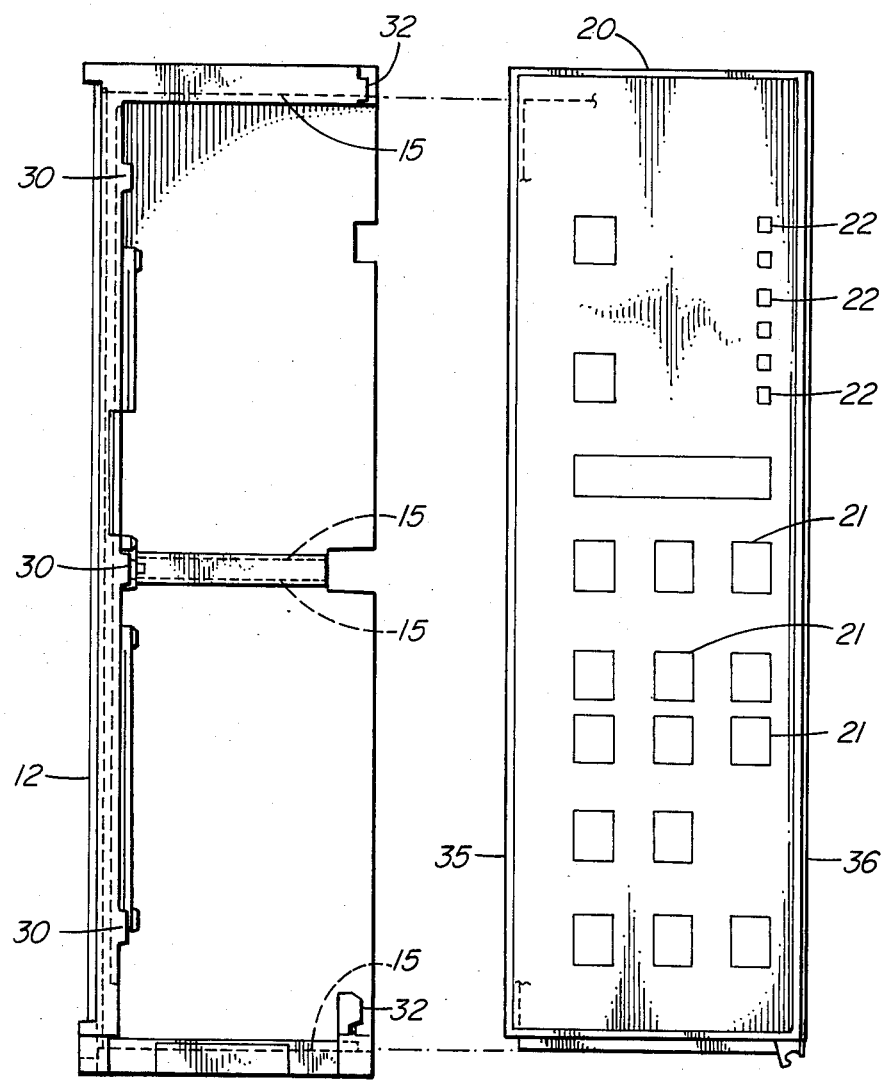
FIG. 2 is an exploded front elevational view of a drawer and a faceplate unit, which form part of the equipment drawer assembly illustrated in FIG. 1.
Figure 3:
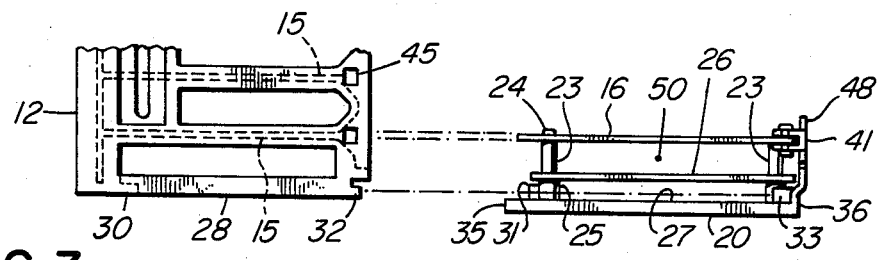
FIG. 3 is an exploded top plan view of a portion of the drawer and the faceplate unit illustrated in FIG. 2.

Referring to FIGS. 1 to 3, the electronic equipment drawer assembly comprises a cabinet 10 having an opening 11 in the front thereof. The equipment drawer assembly includes a drawer 12 which is slideably mounted on telescoping rails 13 in the cabinet 10 through the front opening 11.

The drawer 12 in turn includes opposed sets of narrow channels or tracks 15, two of which are illustrated in greater detail in FIGS. 3 to 6. These tracks 15 slideably retain printed circuit boards 16, one of which is illustrated in FIG. 3. These boards 16 generally contain electronic modules or components including microchips, but for clarity these have not been shown in the drawings. The tracks 15 are disposed orthogonal to the direction of movement of the drawer 12 as it is slideably opened or closed on the telescoping rails 13.

A plastic faceplate 20 having a plurality of control buttons 21 and lights 22, is mounted on the printed circuit board 16 using spacers 23 and is held in place by screws 24 which thread into protrusions 25 on the back of the faceplate 20. Also illustrated in FIG. 3 only is a second printed circuit board 26 disposed between the printed circuit board 16 and the faceplate 20. The printed circuit board 26 provides the interconnections for the pushbuttons 21 and the lights 22. In certain applications this board 26 could be eliminated as shown in FIG. 7, and connections made directly to the printed circuit board 16.

Figure 6:
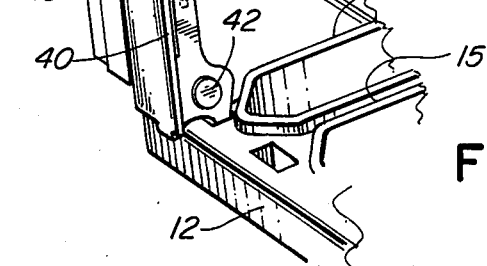

When the printed circuit board 16 is slideably pushed into position along the tracks 15 of the drawer 12 as shown in FIG. 6, the rear surface 27 of the faceplate 20 is contiguous or touching the front surface 28 of the drawer 12 (see alignment of the units as shown in FIG. 3). As a result, when the drawer 12 is pushed into the cabinet 10, pressure applied to the faceplate 20 is transferred directly to the drawer 12 and not to the printed circuit board 16. Excessive pressure resulting in bending of the printed circuit board 16 could readily result in damage to the conducting leads thereon. For clarity, these conducting leads and the associated electrical components which are typically mounted on the printed circuit boards, are not shown in the drawings.

Figure 7:
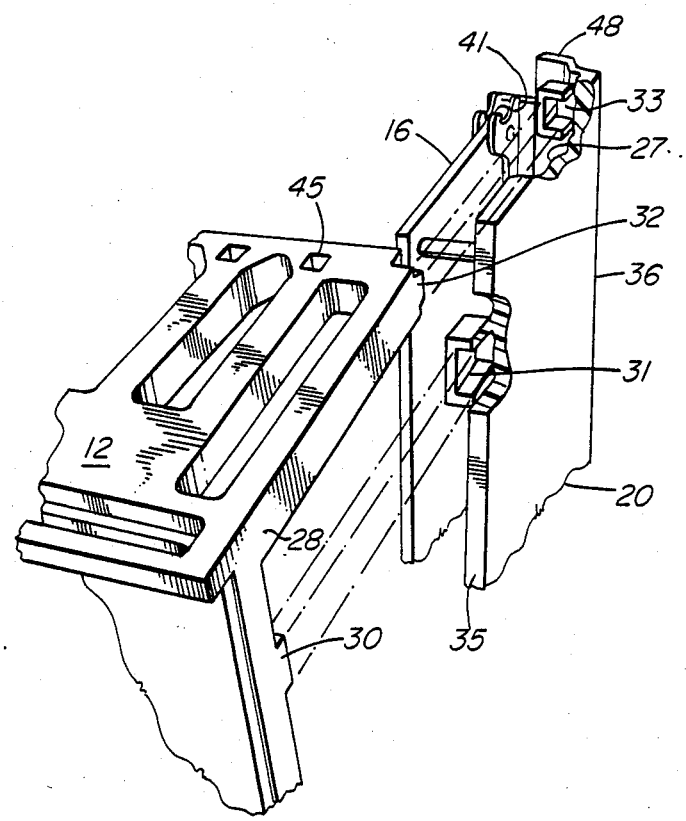
FIG. 7 is an exploded view of part of the drawer and faceplate unit shown in FIGS. 2 and 3, particularly detailing mating pairs of keys and keyholes which secure and align the two units.

As particularly illustrated in FIG. 7, the faceplate 20 and the drawer 12 also include a plurality of mating pairs of keys and keyholes 30, 31, and 32, 33, located on the drawer 12 and the faceplate 20 respectively. The keyhole portions 31, 33 of the mating pairs are adjacent the leading and trailing edges 35 and 36 respectively of the faceplate 20. All mating pairs of keys and keyholes 30, 31, and 32, 33, extend parallel to the tracks 15 so that they slideably engage each other when the printed circuit board and faceplate unit 50 is inserted in the drawer 12. Upon engagement, the mating pairs of keys and keyholes 30, 31 and 32, 33 ensure that when a force is applied to the faceplate 20 to pull out the drawer 12, this force is transferred directly through them to the drawer and not through the printed circuit board 16. The mating pairs of keys and keyholes 30, 31, and 32, 33, also ensure proper alignment of the faceplate 20 with respect to the drawer 12.

Figure 4:
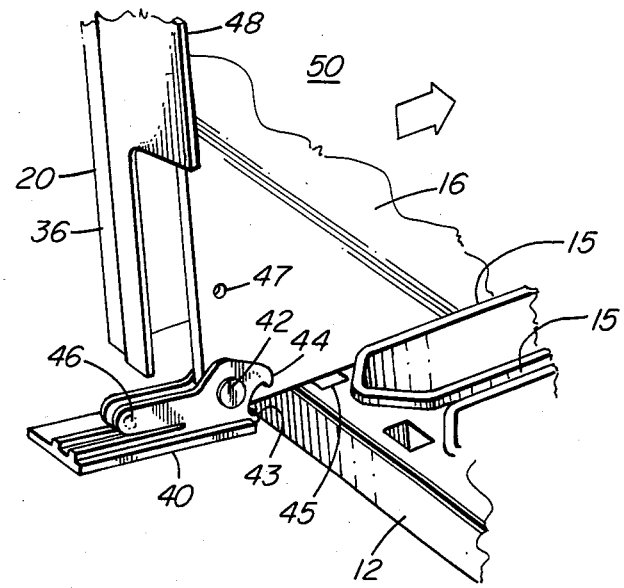
FIGS. 4, 5 and 6 illustrate a latch shown in various positions, which is used to lock the faceplate unit in the drawer illustrated in FIGS. 2 and 3.
Figure 5:
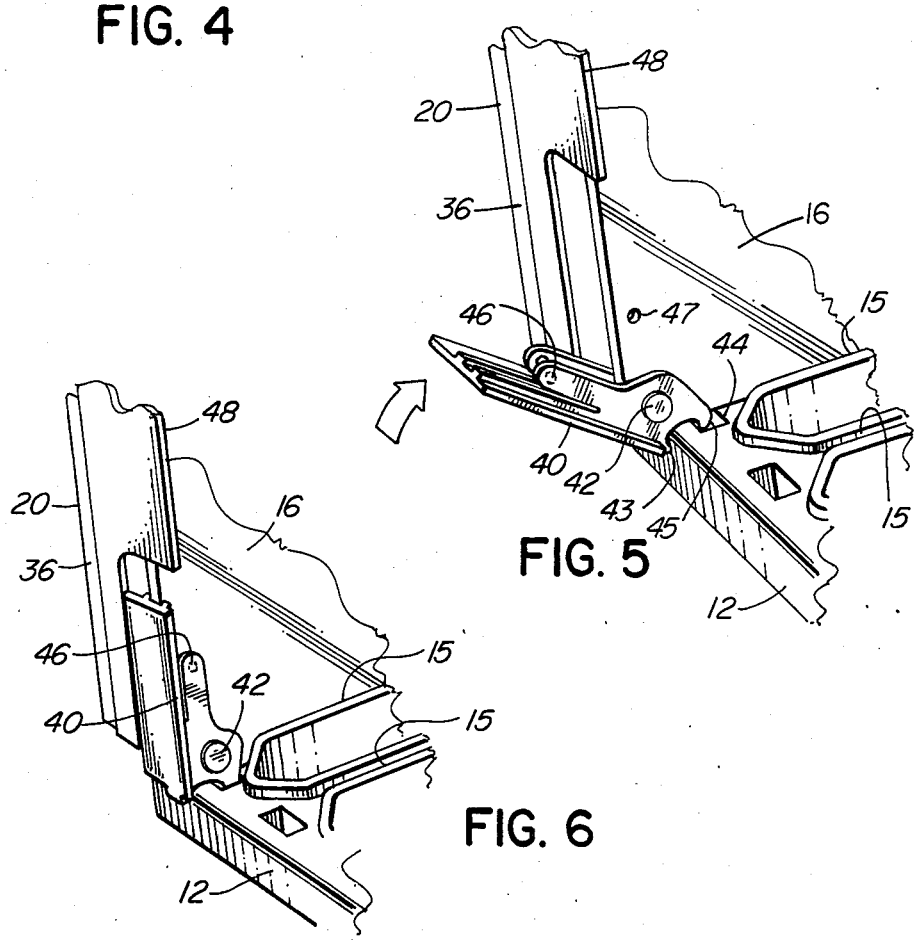

The printed circuit board and faceplate unit 50 also includes a pair of latches 40 and 41, one 40 of which is shown in greater detail in FIGS. 4, 5, and 6. This latch 40 is pivotally mounted on the printed circuit board 16 by a pin 42. As the board 16 is inserted into the drawer 12, FIG. 4, a lower edge 43 of the latch 40 catches the bottom of the drawer 12, thus closing the latch 40 as shown in FIGS. 5 and 6. This action results in a hooked portion 44 of the latch 40 engaging a hole 45 in the drawer 12, while dimpled protrusions 46 engage a hole 47 on the board 16 thereby ensuring that the faceplate and printed circuit board assembly remain in a fully inserted position. The board 16 can however be readily disengaged by lifting the latches 40 and 41 so that they return to their open position as shown in FIGS. 1 and 4.

To further ensure that damage to the printed circuit board 16 does not occur when pressure is applied to the faceplate 20 to remove the drawer 12 from the cabinet 10, the faceplate 20 also includes a side portion 48 which extends rearwards from the trailing edge 36 of the faceplate 20 beyond the circuit board 16 as shown in FIGS. 3 to 6.

What is claimed is:

1. An electronic equipment drawer comprising:
    a cabinet having an opening in its front;
    a drawer slideably mounted in said cabinet through said opening for movement into or out of the cabinet; and having a front facing the opening in the cabinet;
    said drawer including opposed sets of tracks for slideably retaining a plurality of circuit boards, said sets of opposed tracks being disposed orthogonal to the direction of movement of the drawer;
    a faceplate for covering said front of the drawer,
    the faceplate being mounted on one of the plurality of circuit boards and moveable with said one circuit board as said one circuit board is slid along one of said sets of opposed tracks so that portions of the faceplate are slid into contiguous arrangement with the front of the drawer, whereby a force applied to the faceplate for inserting the drawer is substantially transferred directly to the surface of the front of the drawer and not to said one circuit board.

2. An electronic equipment drawer as defined in claim 1 which is further characterized by:
    the faceplate and the drawer having mating pairs of keys and keyholes which extend parallel to the tracks so that they slideably engage each other when said one circuit board is inserted in the drawer, whereby a force applied to the faceplate to pull out the drawer is substantially transferred directly through the mating pairs of keys and keyholes to the drawer and not to said one circuit board.

3. An electronic equipment drawer as defined in claim 2 further characterized by:
    each of the plurality of circuit boards is slideably inserted into the drawer from one side thereof along the opposed sets of tracks with the leading edge of each board first and the trailing edge last, and
    the mating pairs of keys and keyholes are located substantially adjacent the leading and trailing edges of the faceplate when said one circuit board is inserted in the drawer.

4. An electronic equipment drawer as defined in claim 3 further characterized by:
    the faceplate includes a side portion which extends rearwards from the trailing edge of the faceplate beyond said one circuit board and perpendicular to the face of the faceplate so as to prevent damage to said one circuit board when a pulling force is applied to the faceplate.

5. An electronic equipment drawer as defined in claim 4 further characterized by:
    the faceplate is mounted in parallel spaced relationship to said one circuit board by a plurality of spacers located therebetween.

6. An electronic equipment drawer as defined in claim 5 characterized by:
    means for latching said one circuit board in an inserted position in the drawer so as to maintain contact between the mating pairs of keys and keyholes when a sideward force is applied to the faceplate.

* * * * *